(12) United States Patent
Shibata et al.

(10) Patent No.: US 7,933,152 B2
(45) Date of Patent: Apr. 26, 2011

(54) SEMICONDUCTOR MEMORY DEVICE CAPABLE OF INCREASING WRITING SPEED

(75) Inventors: Noboru Shibata, Kawasaki (JP); Kenichi Imamiya, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/641,401

(22) Filed: Dec. 18, 2009

(65) Prior Publication Data

US 2010/0091570 A1    Apr. 15, 2010

Related U.S. Application Data

(63) Continuation of application No. 12/168,457, filed on Jul. 7, 2008, now Pat. No. 7,663,919, which is a continuation of application No. 11/457,320, filed on Jul. 13, 2006, now Pat. No. 7,411,824.

(30) Foreign Application Priority Data

Jul. 14, 2005 (JP) ................................ 2005-205950

(51) Int. Cl.
*G11C 16/06* (2006.01)
(52) U.S. Cl. ......... 365/185.11; 365/185.24; 365/185.17; 365/230.06
(58) Field of Classification Search ............. 365/185.11, 365/185.24, 185.17, 230.06
See application file for complete search history.

(56) References Cited

U.S. PATENT DOCUMENTS

| | | | |
|---|---|---|---|
| 5,477,495 A | 12/1995 | Tanaka et al. | |
| 5,532,971 A | 7/1996 | Tanaka et al. | |
| 5,748,538 A | 5/1998 | Lee et al. | |
| 6,031,760 A | 2/2000 | Sakui et al. | |
| 6,038,170 A | 3/2000 | Shiba | |
| 6,657,891 B1 | 12/2003 | Shibata et al. | |
| 6,690,596 B2 | 2/2004 | Hosono et al. | |
| 6,791,878 B2 | 9/2004 | Jeong | |
| 6,801,458 B2 | 10/2004 | Sakui et al. | |
| 6,862,223 B1 | 3/2005 | Lee et al. | |
| 6,876,578 B2 | 4/2005 | Shibata et al. | |
| 6,925,004 B2 | 8/2005 | Shibata et al. | |
| 6,961,268 B2 | 11/2005 | Umezawa | |
| 7,212,434 B2 | 5/2007 | Umezawa | |
| 7,366,018 B2 | 4/2008 | Shibata | |

(Continued)

FOREIGN PATENT DOCUMENTS

JP    09-082922    3/1997

(Continued)

OTHER PUBLICATIONS

Japanese Office Action (with English translation) issued on Feb. 1, 2011, in Japanese Patent Application No. 2005-205950 (5 pages).

*Primary Examiner* — Thong Q Le
(74) *Attorney, Agent, or Firm* — Oblon, Spivak, McClelland, Maier & Neustadt, L.L.P.

(57) ABSTRACT

A memory cell array has a structure in which a plurality of memory cells connected with word lines and bit lines and connected in series are arranged in a matrix form. A selection transistor selects the word lines. A control circuit controls potentials of the word lines and the bit lines in accordance with input data, and controls write, read and erase operations of data with respect to the memory cell. The selection transistor is formed on a well, and a first negative voltage is supplied to a well, a first voltage (the first voltage≧the first negative voltage) is supplied to a selected word line and a second voltage is supplied to a non-selected word line in the read operation.

7 Claims, 14 Drawing Sheets

U.S. PATENT DOCUMENTS

| | | |
|---|---|---|
| 2002/0051402 A1 | 5/2002 | Hosono et al. |
| 2005/0047213 A1 | 3/2005 | Umezawa |
| 2005/0083735 A1 | 4/2005 | Chen et al. |
| 2005/0218460 A1 | 10/2005 | Hasegawa et al. |
| 2005/0243602 A1* | 11/2005 | Umezawa ................ 365/185.11 |
| 2006/0133150 A1 | 6/2006 | Shibata |

FOREIGN PATENT DOCUMENTS

| | | |
|---|---|---|
| JP | 11-045986 | 2/1999 |
| JP | 11-096777 | 4/1999 |
| JP | 2004-192789 | 7/2004 |
| JP | 2005-243211 | 9/2005 |

* cited by examiner

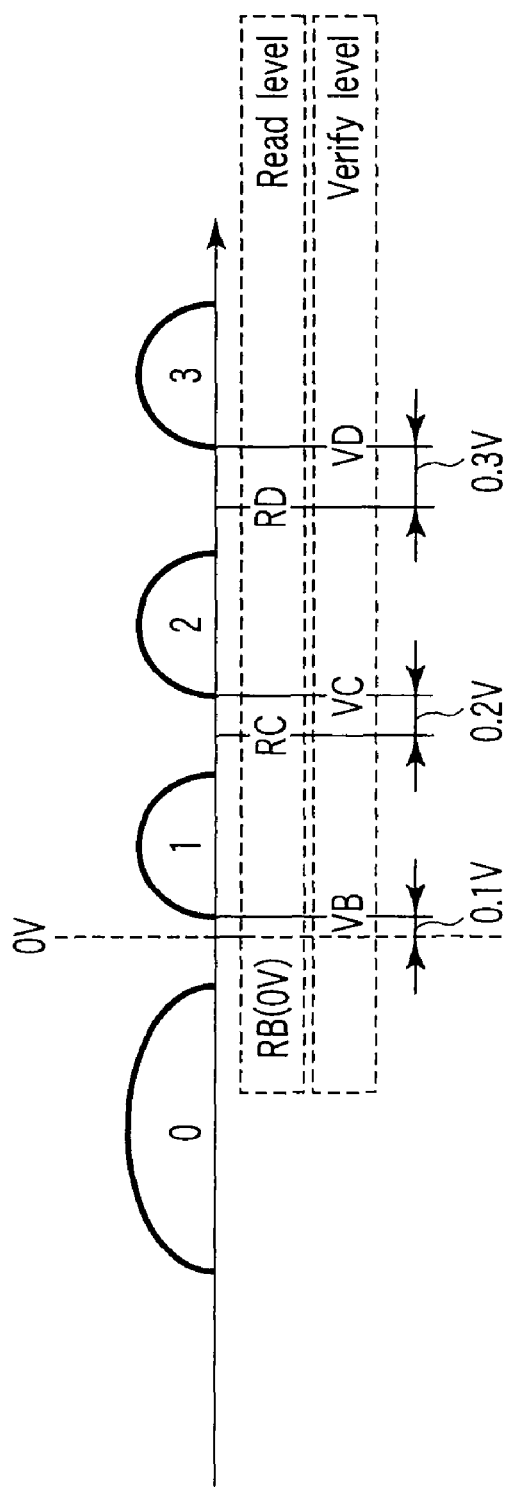
FIG. 1A
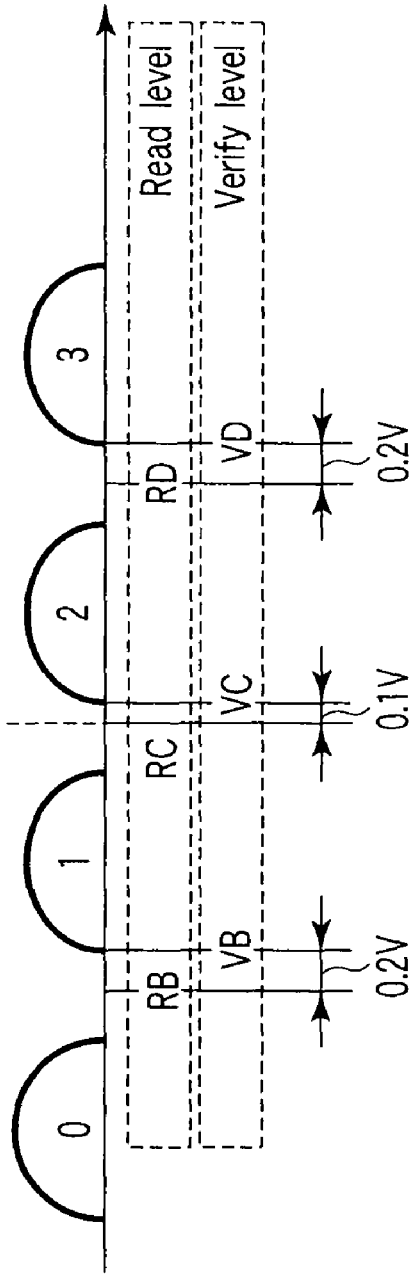
FIG. 1B (Present invention)

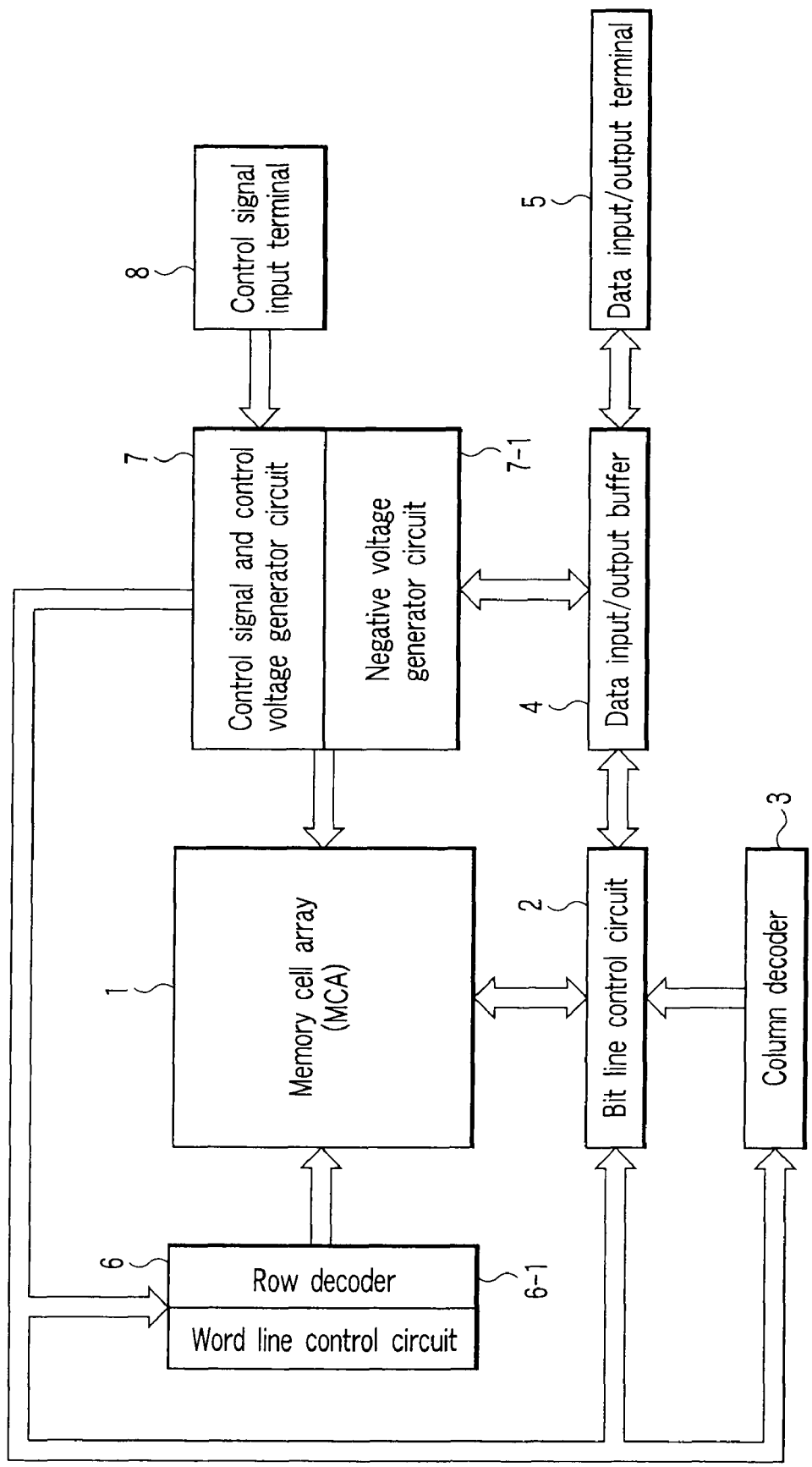
F I G. 2

|  | Cell | | H.V.NTr (Row decoder) | | L.V.NTr | L.V.PTr | H.V.PTr |
| --- | --- | --- | --- | --- | --- | --- | --- |
|  | (P-well) | (N-well) | (P-well) | (N-well) | (P-well) | (N-well) | (N-well) |
| Erase | Vera (20V) | Vera (20V) | Vss (0V) | Vss (0V) | Vss (0V) | Vdd (2.5V) | Vdd (2.5V) |
| Program | Vss (0V) | Vss (0V) | Negative potential (−2 V) | Vss (0V) | Vss (0V) | Vdd (2.5V) | Vdd (2.5V)/Vpgmh |
| Positive read | Vss (0V) | Vss (0V) | Negative potential (−2 V) | Vss (0V) | Vss (0V) | Vdd (2.5V) | Vdd (2.5V)/Vreadh |

FIG. 6

(0 V or neutral threshold voltage)

SEMICONDUCTOR MEMORY DEVICE CAPABLE OF INCREASING WRITING SPEED

CROSS-REFERENCE TO RELATED APPLICATIONS

This application is a continuation of U.S. application Ser. No. 12/168,457 filed Jul. 7, 2008, now U.S. Pat. No. 7,663,919, which is a continuation of U.S. application Ser. No. 11/457,320 filed Jul. 13, 2006, now U.S. Pat. No. 7,411,824, and is based upon and claims the benefit of priority from prior Japanese Patent Application No. 2005-205950, filed Jul. 14, 2005, the entire contents of each of which are incorporated herein by reference.

BACKGROUND OF THE INVENTION

1. Field of the Invention

The present invention relates to, e.g., an NAND flash memory using an EEPROM, and more particularly to a semiconductor memory device capable of storing multivalued data in a single memory cell.

2. Description of the Related Art

In an NAND flash memory, a plurality of memory cells arranged in a column direction are connected in series to constitute NAND cells, and each NAND cell is connected with a corresponding bit line through a selection gate. Each bit line is connected with a latch circuit which latches write data and read data. All or a half of a plurality of cells arranged in a row direction are simultaneously selected, and a write or read operation is collectively carried out with respect to all or a half of the cells selected at the same time. The plurality of NAND cells arranged in the row direction constitute a block, and an erase operation is executed in this block unit. In the erase operation, a threshold voltage of the memory cells is set to a negative voltage. Injecting electrons into the memory cells in a write operation can set the threshold voltage to a positive voltage (see, e.g., Jpn. Pat. Appln. Publication No. 2004-192789).

Meanwhile, in the NAND cell, the memory cells are connected in series. Therefore, in a read operation, a non-selected cell must be in an on state, a voltage (Vread) higher than a threshold voltage is applied to a gate electrode of the non-selected cell. Therefore, in the write operation, the threshold voltage set with respect to cells must not exceed Vread, and a threshold distribution is controlled in such a manner that it does not exceed Vread by repeatedly executing a program operation and a program verify read operation in accordance with each bit in a write sequence.

Further, in recent years, with an increase in a capacity of a memory, a multivalued memory which stores two or more bits in one cell has been developed. For example, in order to store two bits in one cell, four threshold distributions must be set in such a manner that each distribution does not exceed Vread. Therefore, each threshold distribution must be controlled to be narrowed as compared with a case where one bit or two threshold distributions are stored in one cell. Furthermore, in order to store three bits or four bits in one cell, eight or 16 threshold distributions must be set. Therefore, a distribution width of each threshold voltage must be greatly narrowed. In order to narrow a distribution width of a threshold voltage in this manner, a program and a verify operation must be precisely repeated, and there occurs a problem of a decrease in a writing speed. Therefore, a semiconductor memory device capable of increasing a writing speed has been demanded.

BRIEF SUMMARY OF THE INVENTION

According to a first aspect of the invention, there is provided a semiconductor memory device comprising: a memory cell array having a plurality of memory cells which are arranged in a matrix form and connected in series, the plurality of memory cells being connected with word lines and bit lines; a selection transistor which selects the word lines; and a control circuit which controls potentials of the word lines and the bit lines in accordance with input data, the control circuit controlling write, read and erase operations of data with respect to the memory cells, wherein the selection transistor is formed on a well, and a first negative voltage is supplied to the well, a first voltage (the first voltage≧the first negative voltage) is supplied to a selected word line and a second voltage is supplied to a non-selected word line in the read operation.

According to a second aspect of the invention, there is provided a semiconductor memory device comprising: a memory cell array having a plurality of memory cells which are arranged in a matrix form and connected in series, the plurality of memory cells being connected with word lines and bit lines; a selection transistor which selects the word lines; a control circuit which controls potentials of the word lines and the bit lines in accordance with input data, the control circuit controlling write, read and erase operations of data with respect to the memory cells, wherein the selection transistor is formed on a well, and a first negative voltage is supplied to the well and a first voltage (the first voltage≧the first negative voltage) is supplied to a predetermined non-selected word line in the write operation.

According to a third aspect of the invention, there is provided a semiconductor memory device comprising: a memory cell array having a plurality of memory cells which are arranged in a matrix form, the plurality of memory cells being connected with word lines and bit lines; a selection transistor which selects the word lines; and a control circuit which controls potentials of the word lines and the bit lines in accordance with input data, the control circuit controlling write, read and erase operations of data with respect to the memory cells, wherein the selection transistor is formed on a well, and a first negative voltage is supplied to the well and a first voltage (the first voltage≧the first negative voltage) is supplied to a selected word line in an erase verify read operation.

BRIEF DESCRIPTION OF THE SEVERAL VIEWS OF THE DRAWING

FIGS. 1A and 1B are a view showing a relationship between threshold voltages in a related art and the present embodiment;

FIG. 2 is a structural view showing an example of a semiconductor memory device according to the present embodiment;

FIG. 6 is a view showing a potential supplied to each well in an erase operation, a program and a read operation according to the present embodiment;

DETAILED DESCRIPTION OF THE INVENTION

Figure 3:
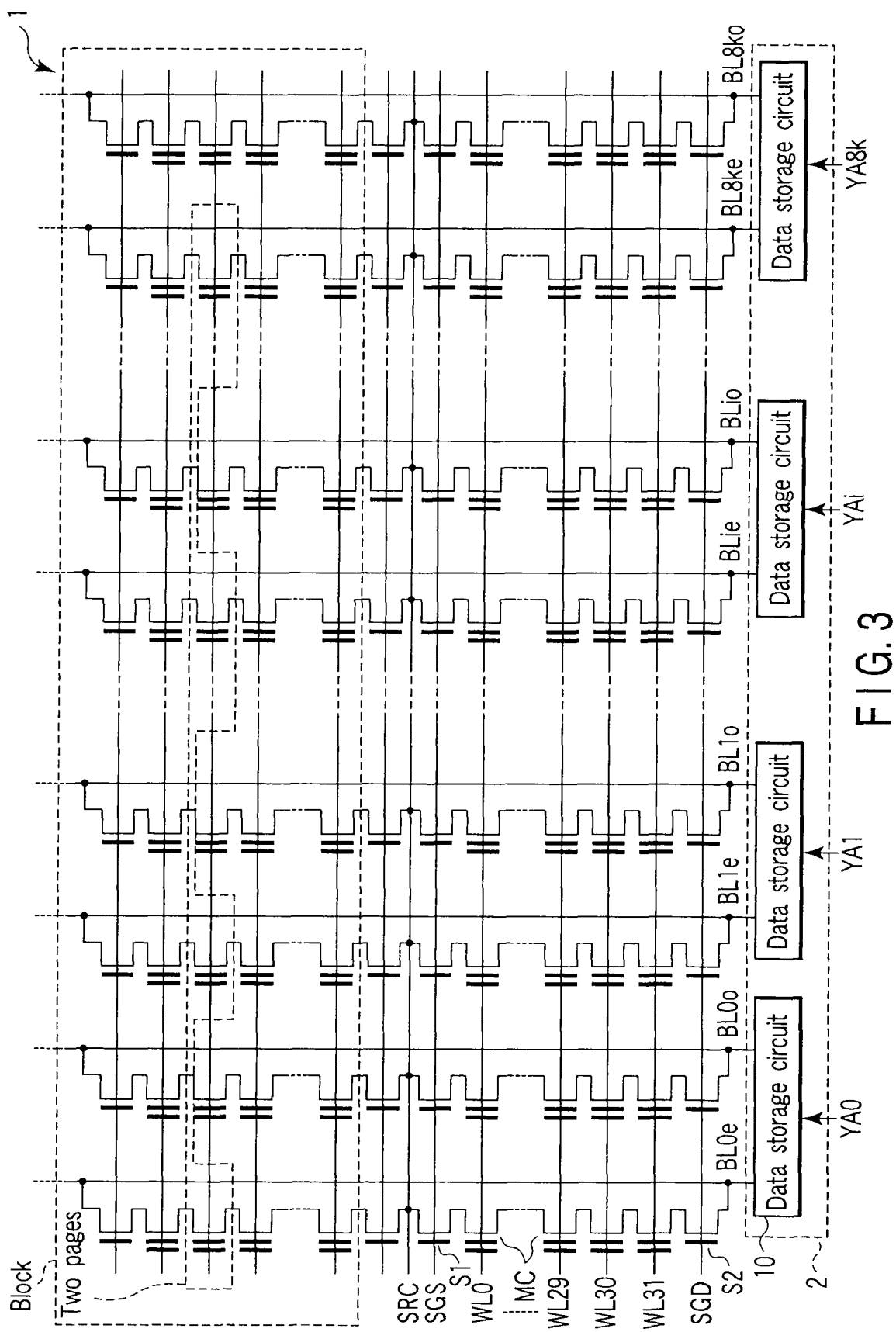
FIG. 3 is a circuit diagram showing a configuration of a memory cell array and a bit line control circuit depicted in FIG. 2.

FIGS. 1A and 1B show a relationship between threshold voltages of a related art and the present embodiment. FIGS. 1A and 1B show a case where four-valued data consisting of two bits is stored.

As shown in FIG. 1B, in the present embodiment, a plurality of negative threshold voltages which are not greater than, e.g., 0 V are also set. When the plurality of negative threshold voltages are also set in this manner, each threshold distribution width can be increased without changing Vread. Therefore, the number of times of executing a program or a verify operation can be decreased, and a writing speed can be increased.

In order to set such threshold voltages, the following structure is required. That is, in order to set a negative voltage in a gate electrode of a selected cell, a negative potential must be set in a word line. Therefore, for example, an N-channel MOS transistor with a high withstand voltage constituting a row decoder is formed in a P-type well (which will be referred to as a P-well) region, and a negative voltage is supplied to this P-well region. At this time, Vread (e.g., 5 V) is supplied to a non-selected word line in a selected block to achieve electrical conduction of the non-selected cell.

Moreover, in writing "1" (non-writing), there has been designed a writing mode which is referred to as RLSB (Revised Local Self Boost) or REASB (Revised Erased Local Self Boost) in order to avoid erroneous writing. In this writing mode, a channel region of a cell which is in close proximity to a write cell in an NAND cell is set to OFF to facilitate booting a potential of the channel region. Therefore, a ground potential is supplied to a word line. However, in the present embodiment, when a cell is an erase cell, its threshold voltage has a larger negative value as compared with the related art as indicated by data "0" in FIG. 1B. Therefore, a negative potential must be supplied to the word line in order to turn off the channel region of the cell which is in close proximity to the write cell.

An embodiment according the present invention will now be described hereinafter with reference to the accompanying drawings.

FIG. 2 shows a configuration of a semiconductor memory device according to this embodiment which is specifically an NAND flash memory which stores, e.g., four-valued (two-bit) data.

A memory cell array 1 includes a plurality of bit lines, a plurality of word lines and a common source line, and memory cells which consist of, e.g., EEPROM cells and in which data can be electrically rewritten are arranged in a matrix form in the memory cell array 1. A bit control circuit 2 which controls bit lines and a word line control circuit 6 are connected with this memory cell array 1.

The bit line control circuit 2 reads data in the memory cells in the memory cell array 1 through bit lines, detects states of the memory cells in the memory cell array 1 through the bit lines, or applies a write control voltage to the memory cells in the memory cell array 1 through the bit lines to write data in the memory cells. A column decoder 3 and a data input/output buffer 4 are connected with the bit line control circuit 2. A data storage circuit in the bit line control circuit 2 is selected by the column decoder 3. Data in each memory cell read to the data storage circuit is output to the outside from a data input/output terminal 5 through the data input/output buffer 4.

Additionally, write data input to the data input/output terminal 5 from the outside is input to the data storage circuit selected by the column decoder 3 through the data input/output buffer 4.

The word line control circuit 6 includes a row decoder 6-1. The word line control circuit 6 selects a word line in the memory cell array 1 through the row decoder 6-1, and applies a voltage required for a read, write or erase operation to the selected word line.

The memory cell array 1, the bit line control circuit 2, the column decoder 3, the data input/output buffer 4 and the word line control circuit 6 are connected with and controlled by a control signal and control voltage generator circuit 7. The control signal and control voltage generator circuit 7 is connected with a control signal input terminal 8, and controlled by a control signal input from the outside through the control signal input terminal 8. The control signal and control voltage generator circuit 7 includes a later-described negative voltage generator circuit 7-1. This negative voltage generator circuit 7-1 generates a negative voltage in the data write or read operation.

The bit line control circuit 2, the column decoder 3, the word line control circuit 6, the control signal and control voltage generator circuit 7 constitute a write circuit and a read circuit.

FIG. 3 shows a configuration of the memory cell array 1 and the bit line control circuit 2 depicted in FIG. 2. A plurality of NAND cells are arranged in the memory cell array 1. One NAND cell is constituted of, e.g., 32 memory cells MC each consisting of an EEPROM which are connected in series, and selection gates S1 and S2. The selection gate S2 is connected with a bit line BL0e, and the selection gate S1 is connected with a source line SRC. Control gates of the memory cells MC arranged in each row are equally connected with word lines WL0 to WL29, WL30 and WL31. Further, the selection gate S2 is equally connected with a select line SGD, and the selection gate S1 is equally connected with a select line SGS.

The bit line control circuit 2 has a plurality of data storage circuits 10. A pair of bit lines (BL0e, BL0o), (BL1e, BL1o) . . . (BLie, BLio) or (BL8ke, BL8ko) are connected with each data storage circuit 10.

As indicated by a broken line, the memory cell array 1 includes a plurality of blocks. Each block is constituted of the plurality of NAND cells, and data is erased in units of, e.g., this block. Furthermore, an erase operation is simultaneously carried out with respect to the two bit lines connected with the data storage circuit 10.

Moreover, a plurality of memory cells (memory cells in a range surrounded by the broken line) which are arranged every other bit line and connected with one word line constitute one sector. Data is written and read in accordance with each sector.

In a read operation, a program verify operation and a program operation, one bit line is selected from the two bit lines (BLie, BLio) connected with the data storage circuit 10 in accordance with an address signal (YA0, YA1 ... YAi ... YA8k) supplied from the outside. Additionally, one word line is selected in accordance with an external address.

Figure 4A:
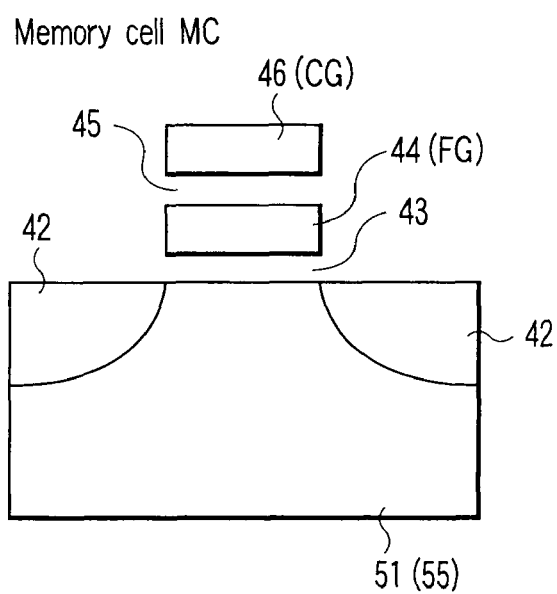
FIGS. 4A and 4B are cross-sectional views showing a memory cell and a selection transistor.
Figure 4B:
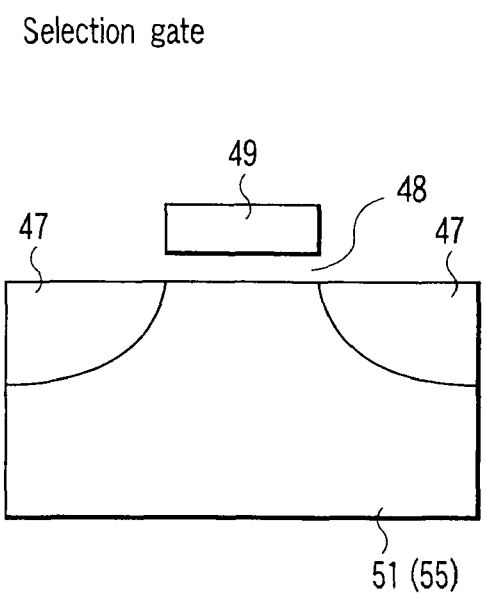

FIGS. 4A and 4B are cross-sectional views of the memory cell and the selection transistor. FIG. 4A shows the memory cell. n-type diffusion layers 42 as a source and a drain of the memory cell are formed in a substrate 51 (a later-described P-well region 55). A floating gate (FG) 44 is formed above the P-well region 55 through a gate insulating film 43, and a control gate (CG) 46 is formed above this floating gate 44 through an insulating film 45. FIG. 4B shows the selection gate. n-type diffusion layers 47 as a source and a drain are formed in the P-well region 55. A control gate 49 is formed above the P-well region 55 through a gate insulating film 48.

Figure 5:
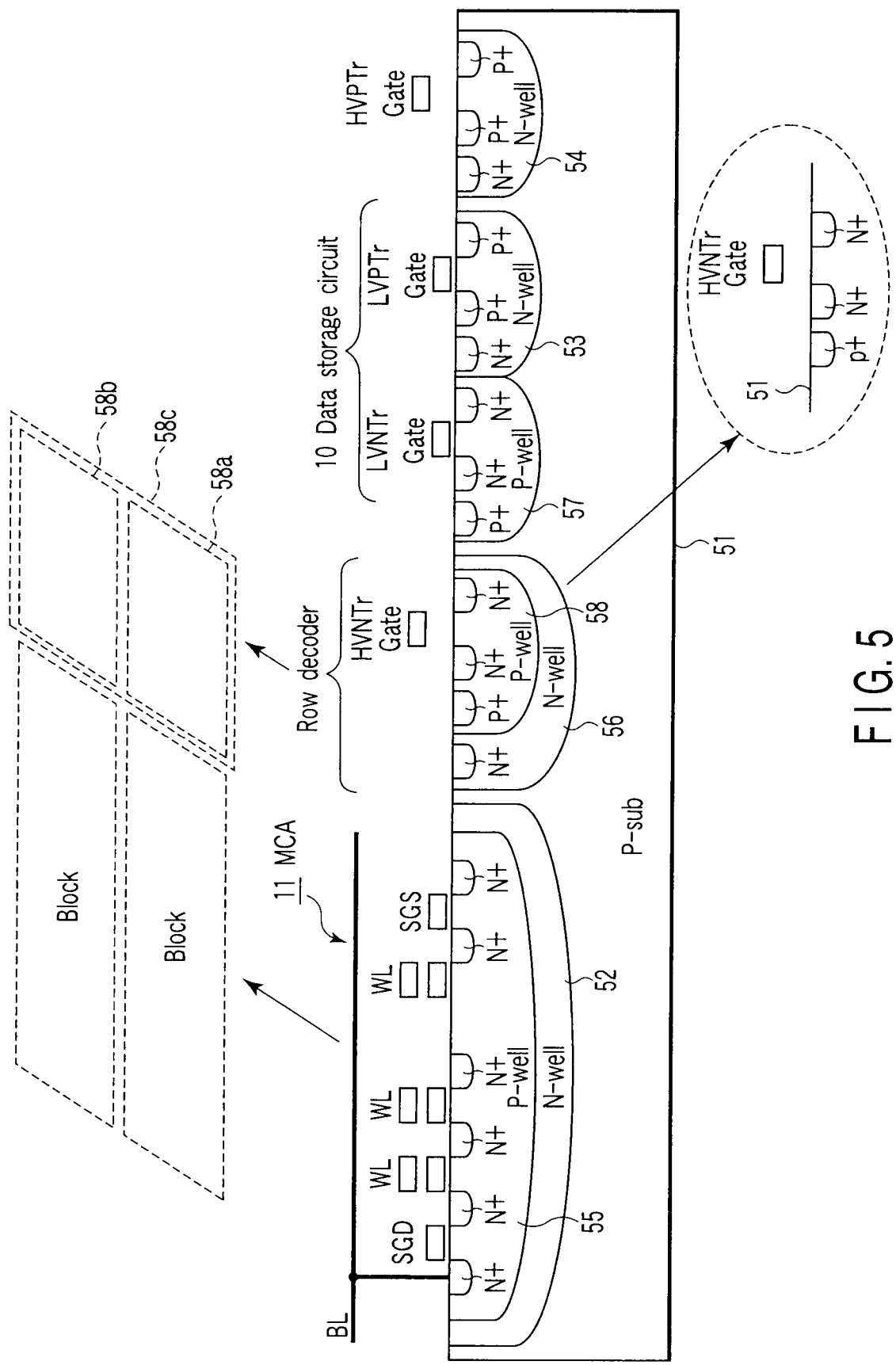
FIG. 5 is a cross-sectional view showing a semiconductor memory device according to the present embodiment.

FIG. 5 is a cross-sectional view showing a semiconductor memory device. For example, N-type well (which will be referred to as N-well hereinafter) regions 52, 53, 54 and 56 and a P-well region 57 are formed, e.g., in a P-type semiconductor substrate 51. A P-well region 55 is formed in the N-well region 52, and a low-voltage N-channel MOS transistor LVNTr constituting the memory cell array 1 is formed in this P-well region 55. Further, a low-voltage P-channel MOS transistor LVPTr and a low-voltage N-channel MOS transistor LVNTr constituting the data storage circuit 10 are formed in the N-well region 53 and the P-well region 57.

A P-well region 58 is formed in the N-well region 56, and a high-voltage N-channel MOS transistor HVNTr constituting the row decoder 6-1 is formed in this P-well region 58. Furthermore, a high-voltage P-channel MOS transistor HVPTr constituting, e.g., a word line drive circuit is formed in the N-well region 54. The high-voltage transistor HVNTr or HVPTr has, e.g., a gate insulating film thicker than that of the low-voltage transistor LVNTr or LVPTr.

FIG. 6 shows a potential supplied to each well in the erase, program and read operations. A negative potential, e.g., −2V is supplied to the P-well 58 in which the N-channel MOS transistor constituting the row decoder 6-1 is formed in the program and data read operations.

Figure 7:
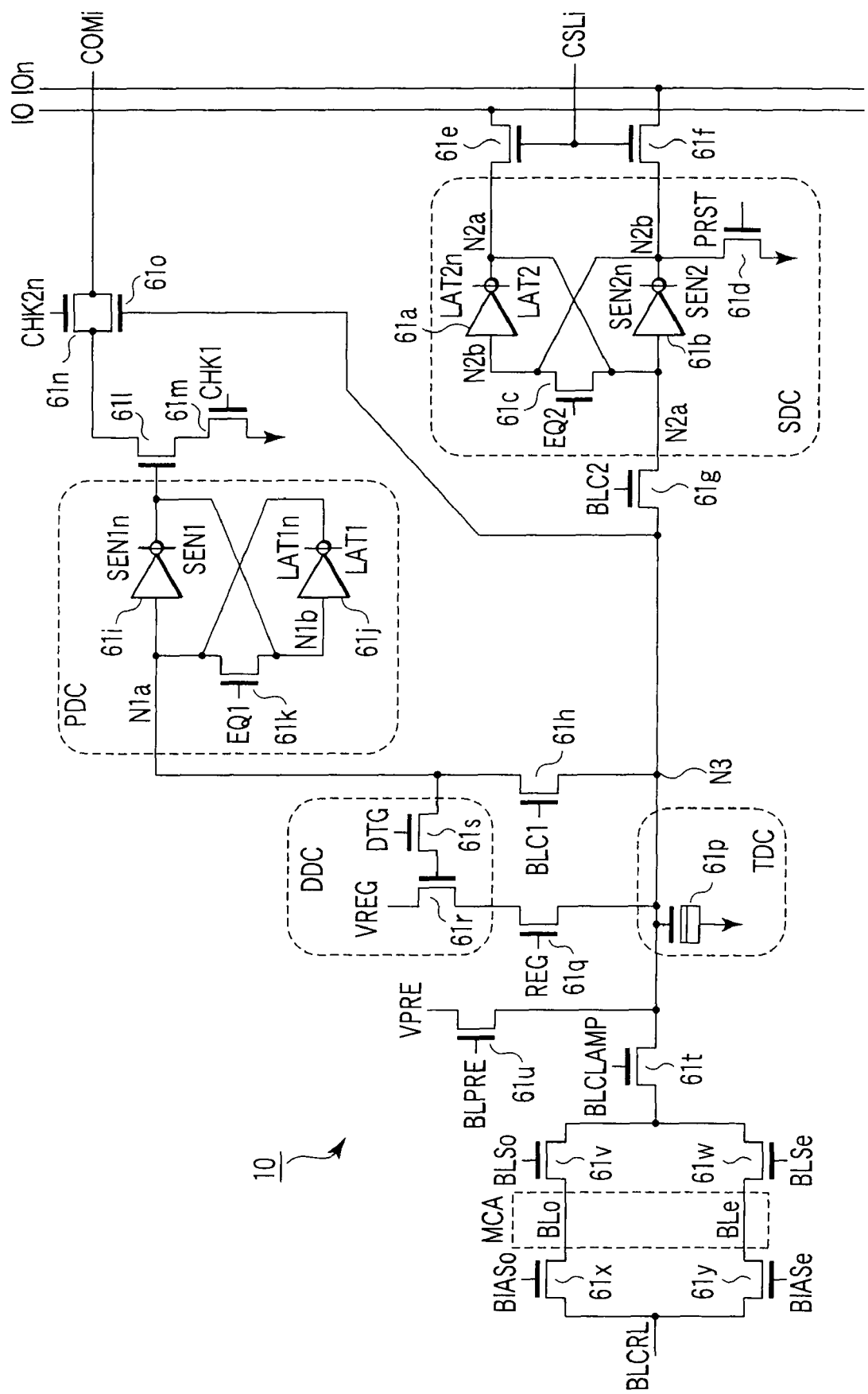
FIG. 7 is a circuit diagram showing an example of a data storage circuit depicted in FIG. 3.

FIG. 7 is a circuit diagram showing an example of the data storage circuit 10 depicted in FIG. 3.

This data storage circuit 10 has a primary data cache (PDC), a secondary cache (SDC), a dynamic data cache (DDC), and a temporary data cache (TDC). The SDC, the PDC and the DDC are used to hold input data in the write operation, hold read data in the read operation, temporarily hold data in the verify operation, and operate internal data when storing multivalued data. The TDC is used to amplify and temporarily hold bit line data when reading data, and operate internal data when storing multivalued data.

The SDC is constituted of clocked inverter circuits 61a and 61b configuring a latch circuit and transistors 61c and 61d. The transistor 61c is connected between an input end of the clocked inverter circuit 61a and an input end of the clocked inverter circuit 61b. A signal EQ2 is supplied to a gate of this transistor 61c. The transistor 61d is connected between an output end of the clocked inverter circuit 61b and the ground.

A signal PRST is supplied to a gate of this transistor 61d. A node N2a of the SDC is connected with an input/output data line IO through a column selection transistor 61e, and a node N2b of the same is connected with an input/output data line IOn through a column selection transistor 61f. A column selection signal CSLi is supplied to gates of these transistors 61e and 61f. The node N2a of the SDC is connected with a node N1a of the PDC through transistors 61g and 61h. A signal BLC2 is supplied to a gate of the transistor 61g, and a signal BLC1 is supplied to a gate of the transistor 61h.

The PDC is constituted of clocked inverter circuits 61i and 61j and a transistor 61k. The transistor 61k is connected between an input end of the clocked inverter circuit 61i and an input end of the clocked inverter circuit 61j. A signal EQ1 is supplied to a gate of this transistor 61k. A node N1b of the PDC is connected with a gate of a transistor 61l. One end of a current path of this transistor 61l is grounded through a transistor 61m. A signal CHK1 is supplied to a gate of this transistor 61m. Moreover, the other end of the current path of the transistor 61l is connected with one end of a current path of transistors 61n and 61o constituting a transfer gate. A signal CHK2n is supplied to a gate of this transistor 61n. Additionally, a gate of the transistor 61o is connected with a connection node N3 of the transistors 61g and 61h. A signal COMi is supplied to the other end of the current path of the transistors 61n and 61o. This signal COMi is a signal common to all the data storage circuits 10, and indicates whether verifying all the data storage circuits 10 has been completed. That is, as will be described later, when the verify operation is completed, the node N1b of PDC changes to a low level. Assuming that the signals CHK1 and CHK2 are on a high level in this state, the signal COMi changes to the high level if the verify operation is completed.

Further, the TDC is constituted of, e.g., an MOS capacitor 61p. This capacitor 61p is connected between the connection node N3 of the transistors 61g and 61h and the ground. Furthermore, the DDC is connected with the connection node N3 through a transistor 61q. A signal REG is supplied to a gate of the transistor 61q.

The DDC is constituted of transistors 61r and 61s. A signal VREG is supplied to one end of a current path of the transistor 61r, and the other end of this current path is connected with a current path of the transistor 61q. A gate of this transistor 61r is connected with the node N1a of the PDC through the transistor 61s. A signal DTG is supplied to a gate of this transistor 61s.

Moreover, one end of a current path of transistors 61t and 61u is connected with the connection node N3. A signal VPRE is supplied the other end of the current path of the transistor 61u, and a signal BLPRE is supplied to a gate of the transistor 61u. A signal BLCLAMP is supplied to a gate of the transistor 61t. The other end of the current path of this transistor 61t is connected with one end of a bit line BLo through a transistor 61v, and further connected with one end of a bit line BLe through a transistor 61w. Signals BLSo and BLSe are respectively supplied to gates of these transistors 61v and 61w. The other end of the bit line BLo is connected with one end of a current path of a transistor 61x. A signal BIASo is supplied to a gate of this transistor 61x. The other end of the bit line BLe is connected with one end of a current path of a transistor 61y. A signal BIASe is supplied to a gate of this transistor 61y. A signal BLCRL is fed to the other end of the current path of these transistors 61x and 61y. The transistors 61x and 61y are complementarily turned on in accordance with the signals BIASo and BIASe, and supply a potential of the signal BLCRL to a non-selected bit line.

Each signal and voltage mentioned above are generated by the control signal and control voltage generator circuit 7 depicted in FIG. 2, and the following operations are brought under control by this control signal and control voltage generator circuit 7.

Figure 8:
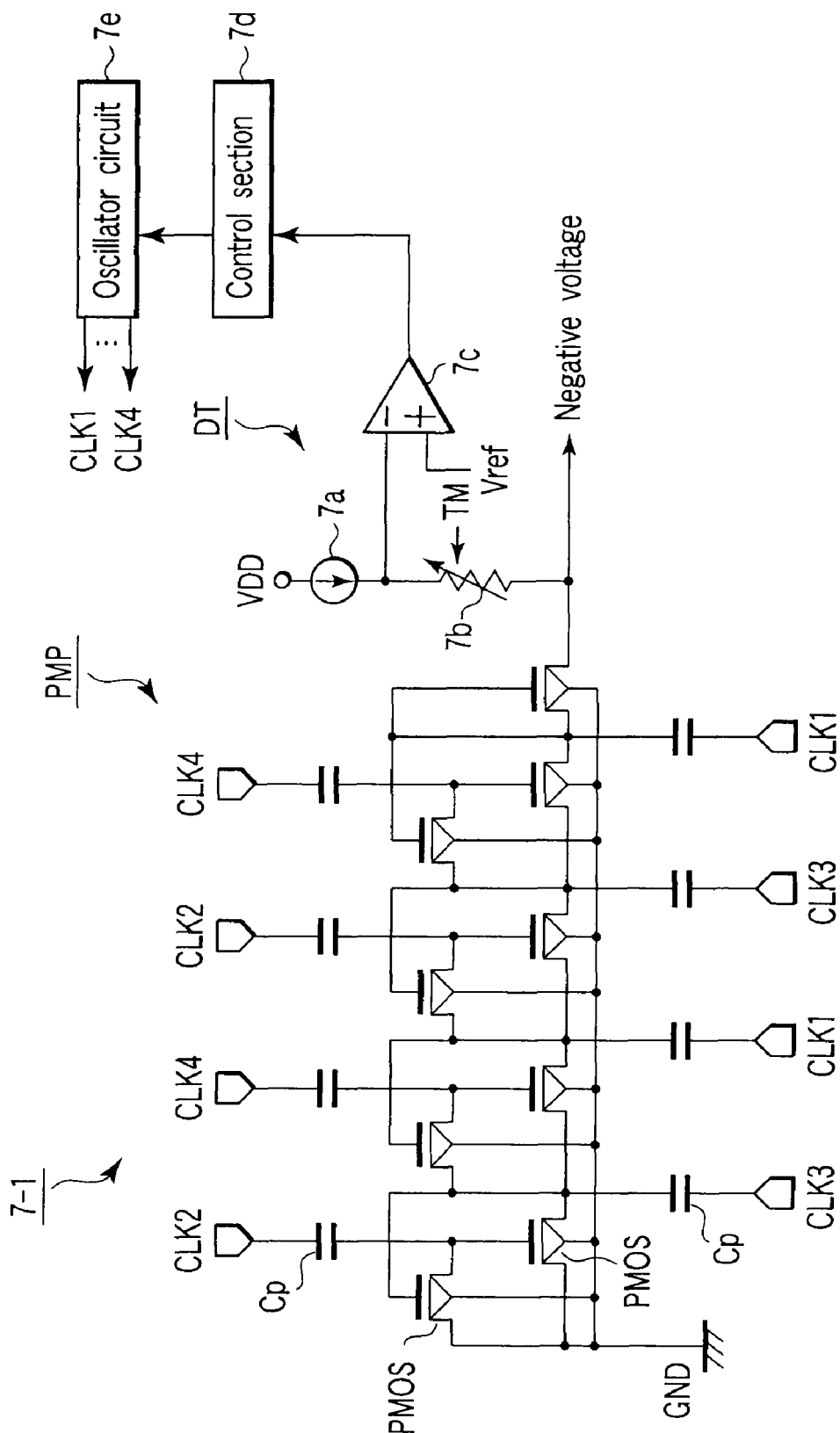
FIG. 8 is a circuit diagram showing an example of a negative voltage generator circuit depicted in FIG. 2.

FIG. 8 shows an example of the negative voltage generator circuit 7-1. The negative voltage generator circuit 7-1 is constituted of, e.g., a four-phase pump circuit PMP, a detection circuit DT, a control section 7*d* and an oscillator circuit 7*e*. The pump circuit PMP is formed of, e.g., a plurality of P-channel MOS transistors PMOS and a plurality of capacitors Cp. Each of clock signals CLK1 to CLK4 is supplied to one end of each capacitor Cp. These clock signals CLK1 to CLK4 sequentially turn on the PMOS, thereby generating a negative voltage.

The detection circuit DT is connected with an output end of the pump circuit PMP. This detection circuit DT is constituted of a constant current source 7*a*, a resistance 7*b* and a differential amplifier 7*c*. The constant current source 7*a* and the resistance 7*b* are connected in series between a node to which a supply power VDD is supplied and the output end of the pump circuit PMP. One input end of the differential amplifier 7*c* is connected with a connection node between the constant current source 7*a* and the resistance 7*b*, and a reference voltage Vref is supplied to the other end of the differential amplifier 7*c*. This reference voltage Vref is a voltage of approximately 1 V generated by, e.g., a band gap reference circuit. This detection circuit DT detects an output voltage of the pump circuit PMP based on the reference voltage Vref. This detection output signal is fed to the control section 7*d*. The control section 7*d* controls the oscillator circuit 7*e* in accordance with the detection output signal. The oscillator circuit 7*e* is oscillated or stopped based on control by the control section 7*b*. In this manner, a constant negative voltage is generated by the pump circuit PMP.

Moreover, the resistance 7*b* constitutes a trimming circuit 7*f*. This trimming circuit 7*f* changes a resistance value of the resistance 7*b* in accordance with a trimming signal TM to switch a level of a negative voltage output from the pump circuit PMP. The trimming signal TM is generated by, e.g., the control signal and control voltage generator circuit 7 in the data read operation or the program verify operation. Therefore, the negative voltage generator circuit 7-1 generates negative voltages on various levels in the data read operation or the program verify operation.

Since this memory is a multivalued memory, data consisting of two bits can be stored in one cell. Two-bit data can be changed over by using an address (a first page or a second page).

Figure 9C:
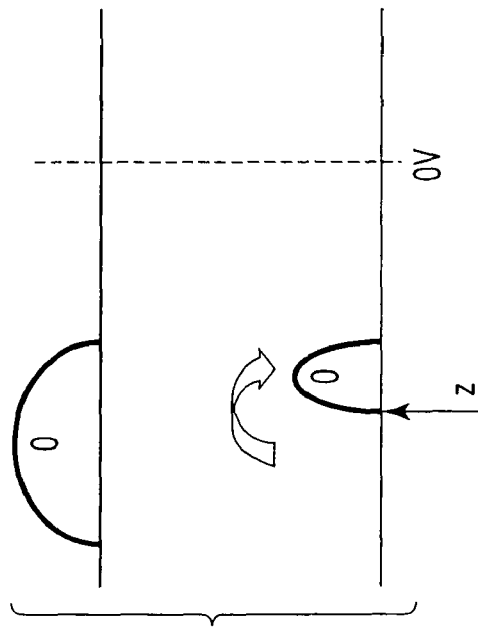
FIGS. 9A, 9B and 9C are views showing a relationship between data in a memory cell and a threshold value of the memory cell.
Figure 9A:
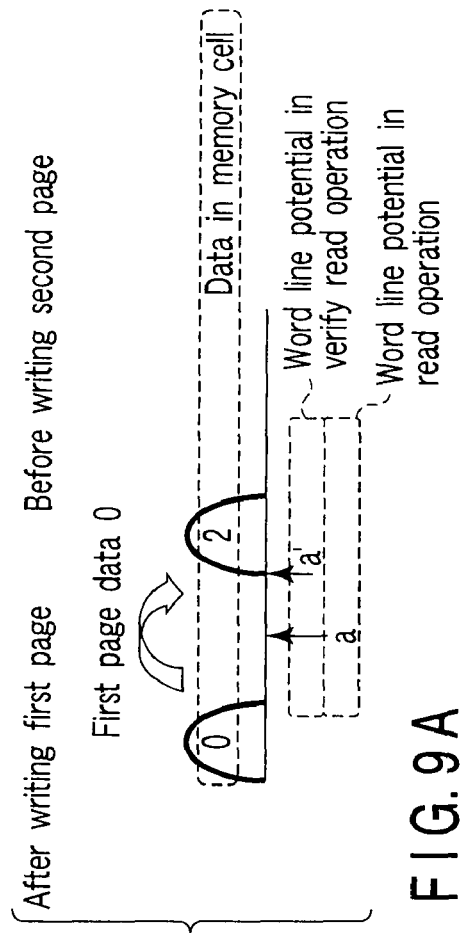
Figure 9B:
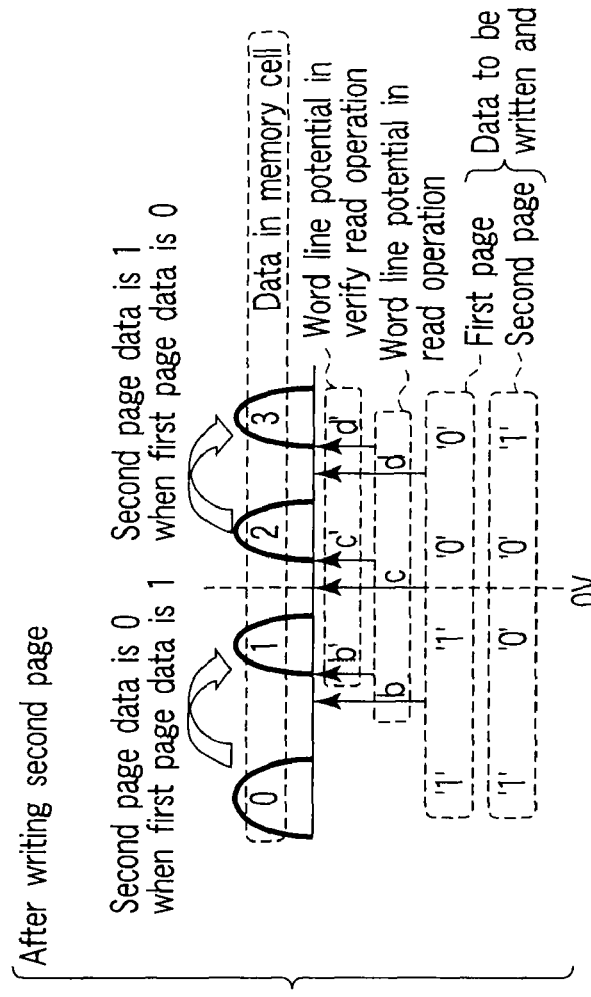

FIGS. 9A, 9B and 9C show a relationship between data in a memory cell and a threshold value of the memory cell. As shown in FIG. 9C, data in the memory cell becomes "0" when erasing is done. The data "0" corresponds to a negative voltage which is not greater than 0 V. As will be described later, in order to apply an RLSB or REASB writing mode, a verify operation is executed based on a verify voltage "z" after erasing. When a threshold voltage is not greater than the verify voltage "z", a write operation is performed until the threshold voltage becomes the verify voltage "z".

As shown in FIG. 9A, the data in the memory cell becomes data "0" and data "2" by writing a first page. Further, as shown in FIG. 9B, after writing a second page, the data in the memory cell becomes data "0", "1", "2" and "3". In this embodiment, the data in the memory cell is defined in an ascending order of the threshold voltage.

Figure 10:
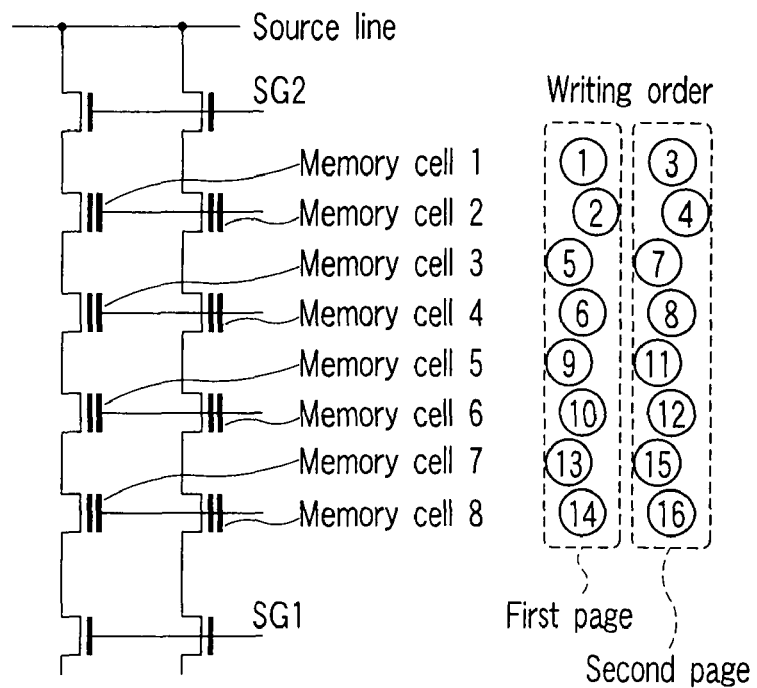
FIG. 10 is a view showing a writing order in the present embodiment.

FIG. 10 schematically shows a writing order in the present embodiment. As shown in FIG. 10, in a block, a write operation is executed every page from a memory cell close to a source line. In this case, in order to eliminate the influence of a threshold voltage of an adjacent memory cell having data previously written therein, the order of writing data in the memory cells is defined as shown in FIG. 9.

Figure 11:
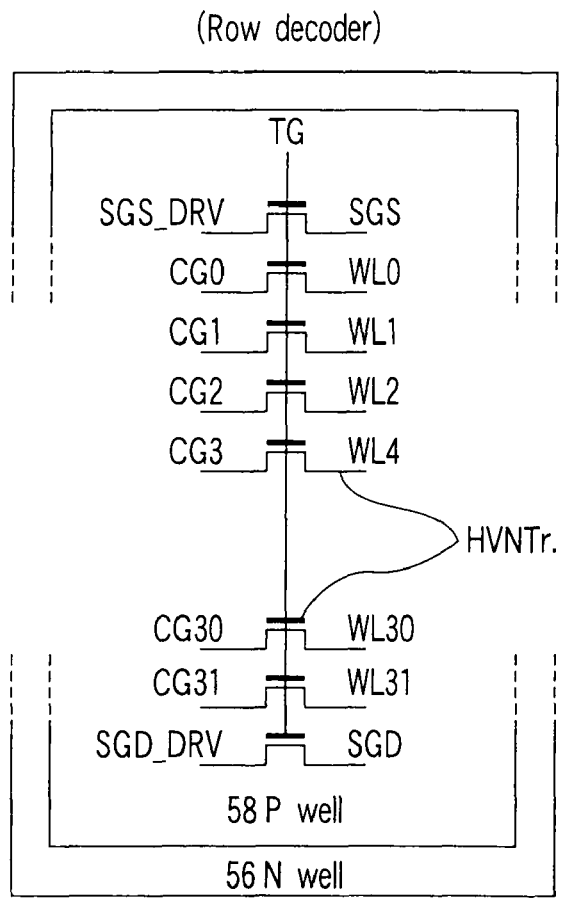
FIG. 11 is a view showing a transfer gate constituting a part of a row decoder depicted in FIG. 2.

FIG. 11 shows a transfer gate constituting a part of the row decoder 6-1. This transfer gate is formed of the plurality of N-channel MOS transistors HVNTr. Voltages SGS_DRV, CG0 to CG31 and SGD_DRV are supplied to one end of each of the transistors HVNTr, and the other end of the same is connected with each of a select line SGS, word lines WL0 to WL31 and a select line SGD. A signal TG is supplied to a gate of each transistor HVNTr. When the transistor HVNTr of each selected block is turned on in accordance with the signal TG, a predetermined voltage is supplied to the word lines WL0 to WL31 of the cells.

It is to be noted that the P-well region 58 in which the row decoder 6-1 is arranged may be divided in accordance with each block (indicated by 58*a* and 58*b* in FIG. 5), or the row decoders of a plurality of or all blocks may be arranged in one P-well region 58 (indicated by 58*c* in FIG. 5).

(Read Operation)

As shown in FIG. 9A, after writing the first page, the data in the memory cell becomes "0" or "2". Therefore, supplying an intermediate level "a" of these data to the word line and performing the read operation enable reading these data. Furthermore, as shown in FIG. 9B, after writing the second page, the data in the memory cell becomes one of "0", "1", "2" and "3". Therefore, supplying each intermediate level "b", "c" or "d" of these data to the word line and performing the read operation enable reading these data. In this embodiment, the level "a" and "b" correspond to negative voltages, for example.

The well of the memory cell (the P-well region 55 in FIG. 5), the source line and a non-selected bit line are set to Vss (a ground potential=0 V). When the P-well region 58 is divided in accordance with each block, the P-well region 58 of a non-selected block is set to Vss or a negative potential (e.g., −2 V), and the transfer gate (shown in FIG. 11) of the non-selected block is turned off. Moreover, when the row decoders of a plurality of or all blocks are arranged in one P-well region 58, the P-well region 58 is set to a negative potential (e.g., −2 V), and the transfer gate of the non-selected block (shown in FIG. 11) is turned off. As a result, the word line of the non-selected block enters a floating state, and the selection gate becomes Vss.

When a negative potential (e.g., −2 V) is supplied to the P-well region 58 of the row decoder in a selected block and the transfer gate of the selected block is turned on, a potential in reading (e.g., −2 V to 3V) is supplied to a selected word line of the selected block, Vread (e.g., 5 V) is fed to a non-selected word line of the selected block, and Vsg (Vdd+Vth, e.g., 2.5 V+Vth) is supplied to the selection gate SG1 of the selected block. Here, when the potential in reading is not negative, the P-well region may be set to Vss.

Then, a signal VPRE of the data storage circuit 10 depicted in FIG. 7 is set to Vdd (e.g., 2.5 V), a signal BLPRE is set to Vsg (Vdd+Vth), a signal BLCLAMP is set to, e.g., (0.6 V+Vth), and a bit line is pre-charged to, e.g., 0.6 V. Subsequently, a select line SG2 of the cell on the source side is set to Vdd. When a threshold voltage of the memory cell is higher than the potential in reading, the cell is turned off, and hence the bit line remains in the high level. Additionally, when a threshold voltage of the memory cell is lower than the potential in reading, the cell is turned on, and hence a potential of the bit line becomes Vss.

Thereafter, the signal BLPRE of the data storage circuit 10 shown in FIG. 7 is temporarily set to Vsg (Vdd+Vth), the node N3 of the TDC is pre-charged to Vdd, and then the signal BLCLAMP is set to, e.g., (0.45+Vth). The node N3 of the TDC changes to the low level when a potential of the bit line is lower than 0.45 V, and it changes to the high level when a potential of the bit line is higher than 0.45 V. After setting the BLCLAMP to Vss, the signal BLC1 is set to Vsg (Vdd+Vth), and a potential of the TDC is read to the PDC. Therefore, the PDC enters the low level when a threshold voltage of the cell is lower than a potential of the word line, and the PDC enters the high level when the same is higher than a potential of the word line. The read operation is executed in this manner.

(Program)

(First Page Write Operation)

Figure 12:
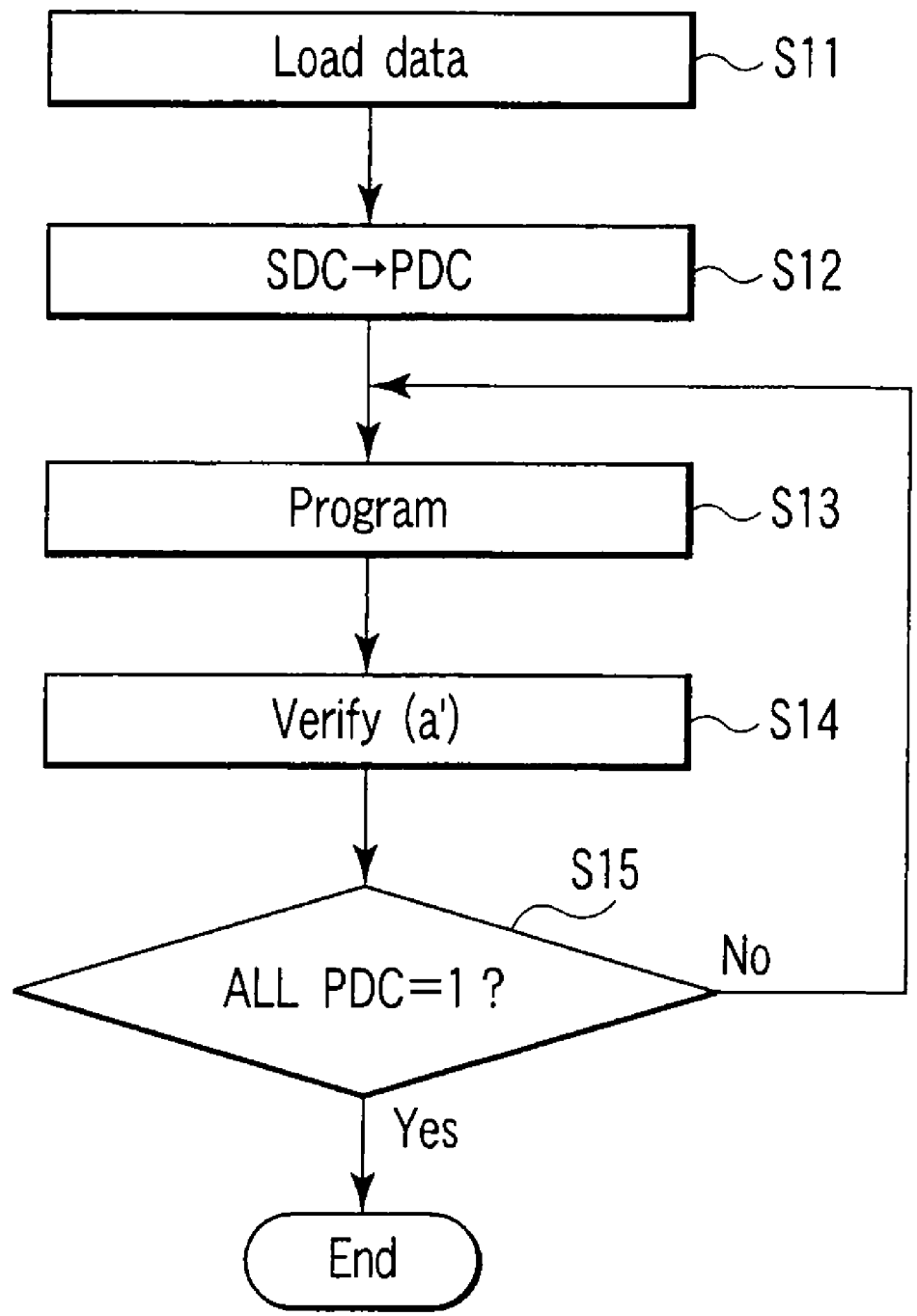
FIG. 12 is a flowchart showing a write operation for a first page.
Figure 13:
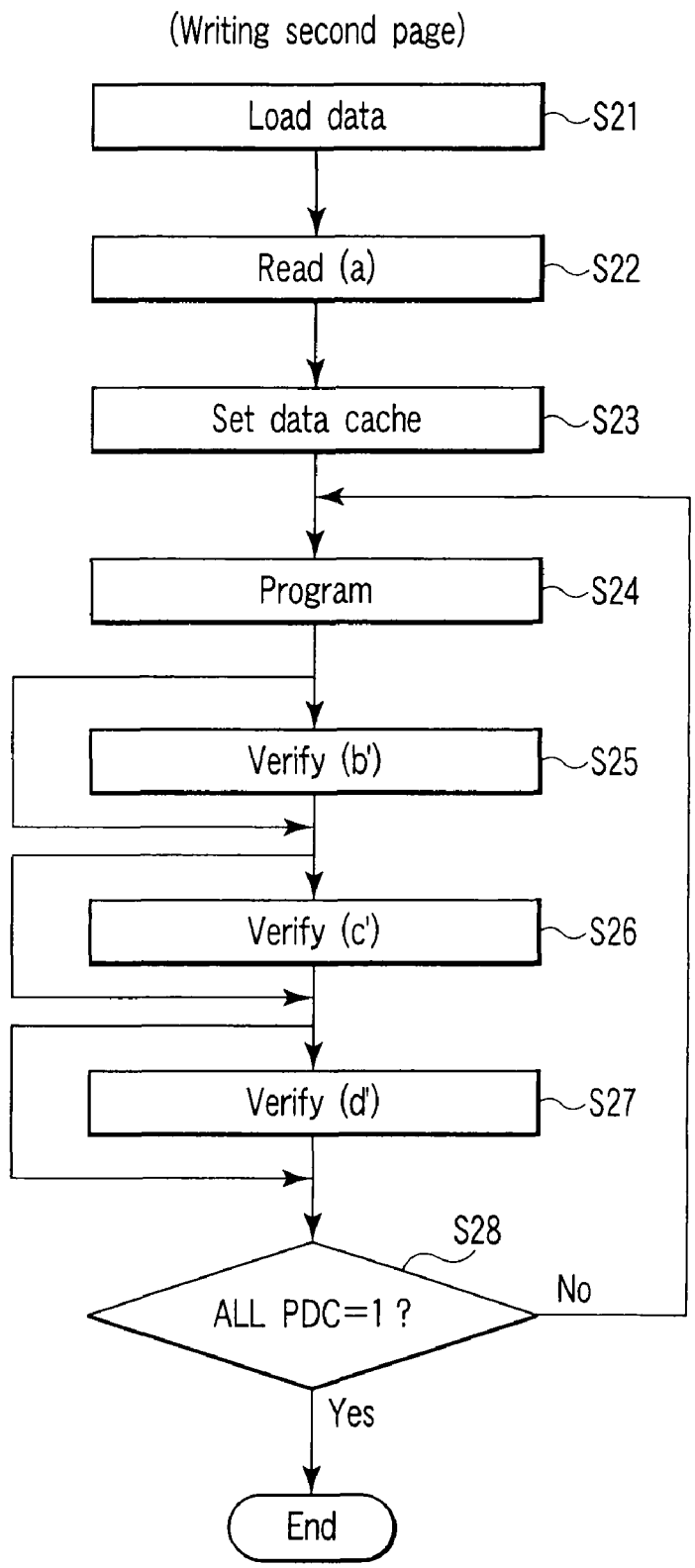
FIG. 13 is a flowchart showing the write operation for a second page.

FIG. 12 shows a sequence of writing the first page, and FIG. 13 illustrates a sequence of writing the second page.

In a program operation, an address is first specified, and a half of memory cells (two pages) connected with one word line are selected as shown in FIG. 3. This memory can perform the program operation only in the order of the first page and the second page of these two pages. Therefore, the first page is first selected by using the address.

In the first page write operation shown in FIG. 12, write data is first input from the outside, and it is stored in the SDC of all the data storage circuits 10 (S11). Then, when a write command is input, data in the SDC in all the data storage circuits 10 is transferred to the PDC (S12). The node N1*a* of the PDC changes to the high level when data "1" (writing is not executed) is input from the outside, and the node N1*a* of the PDC changes to the low level when data "0" (writing is executed) is input. Thereafter, the data in the PDC has a potential of the node N1*a*, and the data in the SDC has a potential of the node N2*a*.

(Program Operation) (S13)

In the data storage circuit 10 shown in FIG. 7, when the signal BLC1 is set to Vdd+Vth, the transistor 61*h* becomes electrically conductive. Therefore, the bit line is set to Vdd when the data "1" (writing is not executed) is stored in the PDC, and the bit line is set to Vss when the data "1" (writing is executed) is stored in the same. Further, writing must not be performed in a cell having a non-selected page (a bit line is not selected) which is connected with a selected word line. Therefore, the bit line connected with such a cell is set to Vdd like a bit line to which the data "1" is supplied.

In this state, when the P-well region 58 is divided in accordance with each block, the P-well region 58 of a non-selected block is set to Vss or a negative potential (e.g., −2 V), and the transfer gate (shown in FIG. 11) of the non-selected block is turned off. When the row decoders of a plurality of or all blocks are arranged in one P-well region 58, the P-well region 58 is set to a negative potential (e.g., −2 V), and the transfer gate (shown in FIG. 11) of the non-selected block is turned off. As a result, the word line of the non-selected block enters the floating state, and the selection gate has a potential of Vss.

Furthermore, the P-well region 58 of the row decoder in a selected block is set to a negative potential (e.g., −2 V), and electrical conduction is achieved in the transfer gate of the selected block, whereby Vdd (or a potential slightly lower than Vdd) is supplied to the selection gate SGD of the selected block. Moreover, when Vss is supplied to the selection gate SGS of the selected block, Vpgm (20 V) is supplied to the selected word line and Vpass (10 V) is supplied to the non-selected word line, a channel of the cell is set to Vss and the word line is set to Vpgm if the bit line has a potential of Vss, thereby effecting writing. On the other hand, if the bit line has a potential of Vdd, the channel of the cell is booted by coupling rather than Vss. Therefore, a potential difference between the gate and the channel is reduced, and writing is not carried out.

When writing is executed in the order depicted in FIG. 10, the number of cells in which data is written is increased as distanced from the source line. Therefore, there is a problem that the channel is hard to be booted and erroneous writing is executed. In order to solve this problem, the RLSB writing mode or the REASB writing mode has been developed. In the RLSB writing mode, an adjoining word line of a selected word line or a word line adjacent to the adjoining word line is set to Vss, and the selected word line is set to Vpgm, and other word lines are set to Vpass or an intermediate potential. Additionally, in the REASB writing mode, an adjoining word line of a selected word line on a source side or a word line adjacent to the adjoining word line is set to Vss, the selected word line is set to Vpgm, and other word lines are set to Vpass or an intermediate potential. The adjoining word line of the selected word line or the word line adjacent to the adjoining word line is set to Vss to turn off the memory cell, thereby facilitating booting a channel immediately below a selected cell.

Figures 14A, 14B, 14C:
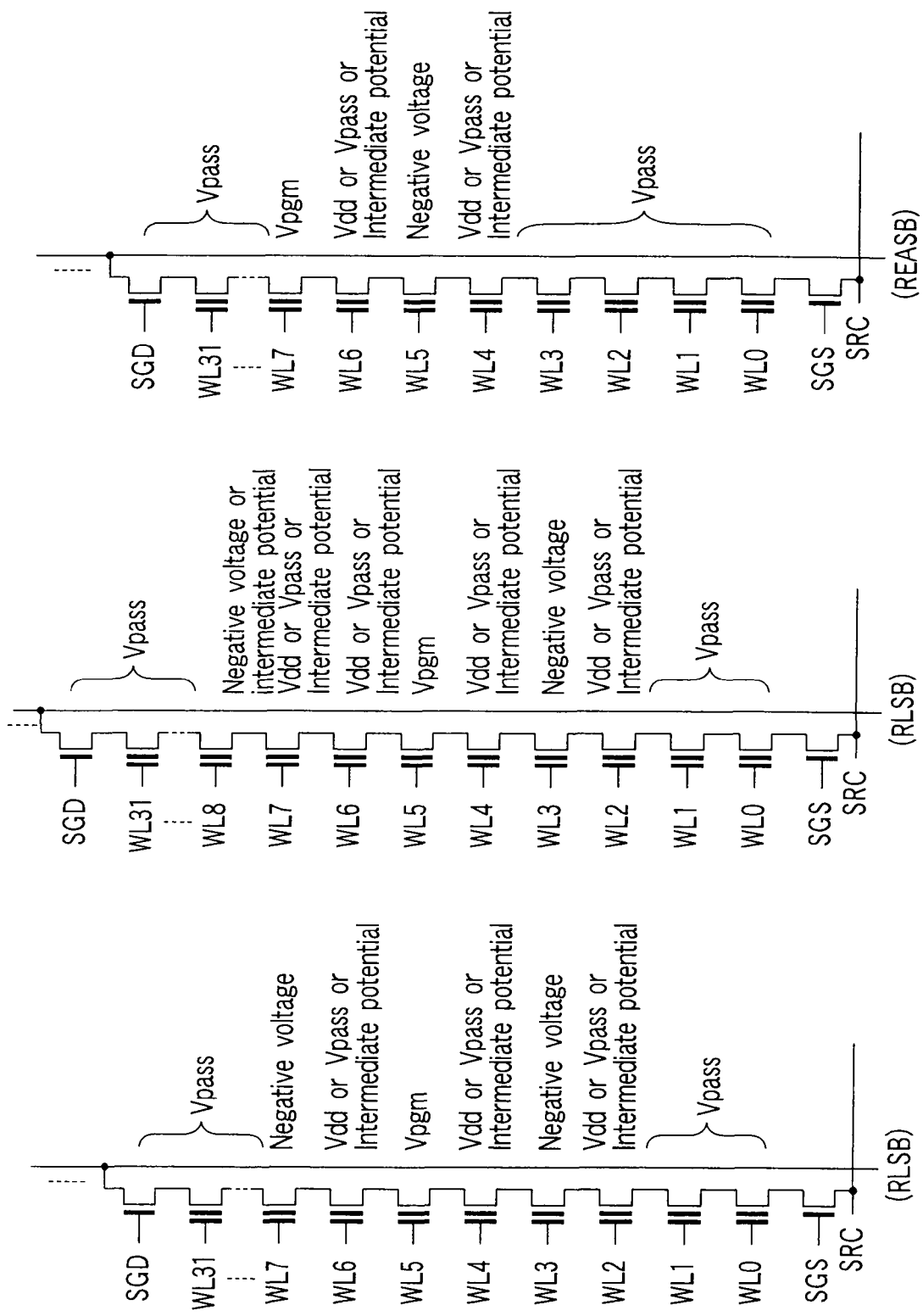
FIGS. 14A and 14B are views showing a voltage of each portion in an RLSB write mode.
FIG. 14C is a view showing a voltage of each portion in an REASB write mode.

In this embodiment, however, when a cell whose word line is set to Vss is an erase cell, a threshold value thereof is a negative voltage, and hence this cell is not turned off. Therefore, in case of the present embodiment, in the RLSB writing mode shown in FIGS. 14A and 14B or the REASB writing mode depicted in FIG. 14C, the adjoining word line of the selected word line or the word line adjacent to the adjoining word line is se to a negative potential, e.g., (−1.5 V) rather than Vss. In writing the first page, data in the memory cell becomes data "0" and data "2".

(Program Verify Read) (S14)

A program verify read operation is the same as the read operation, but a verify level "a'" which is slightly higher than a read level is supplied to a word line to perform reading. When a threshold voltage of the memory cell reaches the verify level "a'" based on this verify reading, the PDC has the data "1", and writing is not executed.

On the other hand, when the threshold voltage of the memory cell does not reach the verify level "a'", the PDC has data "0". In a case where data in all the PDCs in the respective data storage circuits 10 are not "1" (S15), the program is again executed (S13). The program operation and the verify operation are repeated until the data in the PDCs of the respective data storage circuits 10 are all changed to "1".

(Second Page Write Operation)

In the second page write operation depicted in FIG. 13, write data is first input from the outside, and it is stored in the SDCs of all the data storage circuits 10 (S21). Then, in writing the first page, a read level "a" (e.g., a negative voltage) is set to the word line in order to confirm the written data, thereby reading data in the memory cell (S22). This reading operation is as described above. The PDC changes to the low level when a threshold voltage of the cell is lower than a potential "a" of the word line, and the PDC changes to the high level when the same is higher than the potential "a" of the word line.

Thereafter, a data cache is set (S23). That is, the second page is written as shown in FIG. 9B.

When data is "1" in writing the first page, and when data is "1" in writing the second page, the second page is not written.

When the data is "1" in writing the first page, and when the data is "0" in writing the second page, the data in the memory cell is set to "1'" by writing the second page.

When the data is "0" in writing the first page, and when the data is "0" in writing the second page, the data in the memory cell is set to "2" by writing the second page.

When the data is "0" in writing the first page, and when the data is "1" in writing the second page, the data in the cell is set to "3" by writing the second page.

The data cache is set in order to execute this operation.

That is, in a case where the data in the memory cell is set to "0" (the data "1" in the first page, and the data "1" in the second page), the PDC is set to the high level, the DDC is set to the low level, and the SDC is set to the high level.

In a case where the data in the memory cell is set to "1" (the data "1" in the first page, and the data "0" in the second page) the PDC is set to the low level, the DDC is set to the high level, and the SDC is set to the low level.

In a case where the data in the memory cell is set to "2" (the data "0" in the first page, and the data "0" in the second page), the PDC is set to the low level, the DDC is set to the high level, and the SDC is set to the low level.

In a case where the data in the memory cell is set to "3" (the data "0" in the first page, and the data "1" in the second page), the PDC is set to the low level, the DDC is set to the low level, and the SDC is set to the low level.

Each data in the PDC, the DDC and the SDC is set by supplying the signals BLC1, BLC2, DTG, REG and VREG in a predetermined order and transferring data of the PDC, the DDC, the SDC and the TDC. It is to be noted that a specific operation will be eliminated.

(Program Operation) (S24)

A program operation is completely the same as the first page program operation. Writing is not executed when data "1" is stored in the PDC, and writing is carried out when data "0" is stored in the same.

(Verify Operation) (S25, S26 and S27)

Program verify reading is the same as the read operation. However, a verify level "b'", "c'" or "d'" corresponds to a level obtained by adding a margin to a read level, and it is set to a level slightly higher than the read level. Verify reading is executed by using this verify level "b'", "c'" or "d'". For example, the verify level "b'" is a negative voltage, and the verify level "c'" or "d'" is a positive voltage.

The verify operation is executed in the order of, e.g., the verify levels "b'", "c'" and "d'".

That is, the verify level "b'" is first set to the word line, and whether a threshold voltage of the memory cell has reached the verify level "b'" is verified (S25). As a result, when the threshold voltage of the memory cell has reached the verify level, the PDC changes to the high level, and writing is not executed. On the other hand, when the threshold voltage has not reached the verify level, the PDC changes to the low level, and writing is executed in the next program.

Thereafter, the verify level "c'" is set to the word line, and whether the threshold voltage of the memory cell has reached the verify level "c'" is verified (26). As a result, when the threshold voltage of the memory cell has reached the verify level, the PDC is set to the high level, and writing is not executed. On the other hand, when the threshold voltage has not reached the verify level, the PDC is set to the low level, and writing is executed in the next program.

Then, the verify level "d'" is set to the word line, and whether the threshold voltage of the memory cell has reached the verify level "d'" is verified (S27). As a result, when the threshold voltage of the memory cell has reached the verify level, the PDC is set to the high level, and writing is not executed. On the other hand, when the threshold voltage has not reached the verify level, the PDC is set to the low level, and writing is executed in the next program.

The program operation and the verify operation are repeated in this manner until the PDCs in all the data storage circuits 10 are set to the high level.

A specific verify operation will now be described hereinafter.

(Verify (b')) (S25)

In this program verify operation, a verify voltage "b'" is given to a selected word line.

First, a read potential Vread is supplied to a non-selected word line and a select line SG1 in a selected block. The signal BLCLAMP of the data storage circuit 10 is set to 1V+Vth, and the signal BLC2 of the same is set to Vdd+Vth, thereby pre-charging a bit line. At the time of writing data "2" or "3" in a memory cell, data stored in the SDC is "0". Therefore, the bit line is not pre-charged, but the bit line is pre-charged only in writing data "0" or "1" in the memory cell.

Then, a select line SG2 of the cell on the source side is set to the high level. Since the cell is turned off when a threshold voltage thereof is higher than the potential "b'", the bit line remains in the high level. Furthermore, since the cell is turned on when the threshold voltage is lower than the potential "b'", the bit line is set to Vss. During discharge of this bit line, the node N3 of the TDC is temporarily set to Vss, the signal REG is set to the high level to turn on the transistor 61q, and data in the DDC is transferred to the TDC.

Then, the signal DTG is set to the high level to temporarily turn on the transistor 61s, and data in the PDC is transferred to the DDC. Thereafter, data in the TDC is transferred to the PDC. Subsequently, the signal BLPRE of the data storage circuit is set to a voltage Vdd+Vth to turn on the transistor 61u, and the node N3 of the TDC is pre-charged to Vdd. Then, the signal BLCLAMP is set to 0.9 V+Vth to turn on the transistor 61t. Then, the node N3 of the TDC changes to the low level when the bit line is on the low level, and it changes to the high level when the bit line is on the high level.

Here, the low level is stored in the DDC when writing is executed, and the high level is stored in the DDC when writing is not executed. Therefore, when the signal VREG is set to Vdd and the signal REG is set to the high level, the node N3 of the TDC is forcibly set to the high level only in a case where writing is not performed. After this operation, data in the PDC is transferred to the DDC, and a potential of the TDC is read to the PDC. The high level is latched in the PDC when writing is not executed and when data "1" has been written in the memory cell and a threshold voltage of the cell has reached the verify voltage "b'". The low level is latched in the PDC when the threshold voltage of the cell does not reach the potential "b'" and when data "2" or "3" has been written in the memory cell.

(Verify (c')) (S26)

In a cell in which data "2" is written, writing is executed by using a verify voltage "a'" which is lower than the original verify voltage "c'" in the first page. Then, a threshold voltage is increased by writing data in an adjacent cell in some cases, and some cells has reached the original verify voltage "c'" in other cases. Therefore, data "2" is first verified. In this program verify operation, the verify voltage "c'" is applied to a selected word line.

First, a potential Vread is supplied to a non-selected word line and the select line SG1 in a selected block, the signal BLCLAMP of the data storage circuit 10 shown in FIG. 7 is set to 1 V+Vth, and the signal REG is set to Vdd+Vth, thereby pre-charging a bit line. In case of writing data "0" or "3" in a memory cell, since the DDC is set to the low level, and hence the bit line is not pre-charged. Further, in case of writing data "1" or "2" in the memory cell, the DDC is set to the high level. Therefore, the bit line is pre-charged.

Then, the select line SG2 of the NAND cell on the source side is set to the high level. When a threshold voltage of the cell is higher than "c'", the cell is turned off. Therefore, the bit line remains in the high level. Moreover, when the threshold voltage of the cell is lower than "c'", the cell is turned on. Therefore, the bit line is set to Vss. During discharge of the bit line, the node N3 of the TDC is temporarily set to Vss. Then, the signal REG is set to the high level to turn on the transistor 61q, and data in the DDC is transferred to the TDC.

Subsequently, the signal DTG is set to Vdd+Vth to temporarily turn on the transistor 61s, and data in the PDC is transferred to the DDC. Then, data in the TDC is transferred to the PDC.

Subsequently, the signal VPRE is set to Vdd and the signal BLPRE is set to Vdd+Vth, whereby the node N3 of the TDC is pre-charged to Vdd. Thereafter, the signal BLCLAMP is set to 0.9 V+Vth to turn on the transistor 61t. The node N3 of the TDC changes to the low level when the bit line is on the low level, and it changes to the high level when the bit line is on the high level.

Here, a low-level signal is stored in the DDC when writing is executed, and a high-level signal is stored in the DDC when writing is not executed. Therefore, when the signal VERG is set to Vdd and the signal REG is set to Vdd+Vth, the node N3 of the TDC is forcibly set to the high level only when writing is not executed.

Then, data in the PDC is transferred to the DDC, and a potential of the TDC is read to the PDC. The high-level signal is latched in the PDC only when writing is not executed and when data "2" is written in the memory cell and a threshold voltage of the cell has reached "c'" which is the verify voltage. The low level is latched in the PDC when the threshold voltage of the cell does not reach "c'" and when data "1" or "3" has been written in the memory cell.

(Verify (d')) (S27)

In this program verify operation, a verify voltage "d'" is supplied to a selected word line. In this state, Vread is first supplied to a non-selected word line and the select line SG1 in a selected block, the signal BLCLAMP is set to 1 V+Vth, and the signal BLPRE is set to Vdd+Vth to turn on the transistors 61t and 61u, thereby pre-charging a bit line.

Then, the select line SG2 of the cell on the source side is set to the high level. Since a cell whose threshold voltage is higher than the potential "d'" is turned off, the bit line remains in the high level. Additionally, since a cell whose threshold voltage is lower than the potential "d'" is turned on, the bit line is set to Vss. During discharge of this bit line, the node N3 of the TDC is set to Vss, the signal REG is set to the high level, the transistor 61q is turned on, and data in the DDC is transferred to the TDC.

Then, the signal DTG is set to the high level, the transistor 61s is turned on, and data in the PDC is transferred to the DDC. Thereafter, data in the TDC is transferred to the PDC. Then, the signal BLPRE is set to Vdd+Vth to turn on the transistor 61u, and the node N3 of the TDC is pre-charged to Vdd. Thereafter, the signal BLCLAMP is set to 0.9 V+Vth to turn on the transistor 61t. The node N3 of the TDC changes to the low level when the bit line is on the low level, and it changes to the high level when the bit line is on the high level.

Here, the low level is stored in the DDC when writing is executed, and the high level is stored in the DDC when writing is not executed. Therefore, the signal VREG is set to Vdd, and the signal REG is set to the high level, thereby turning on the transistor 61q. Then, the node N3 of the TDC is forcibly set to the high level only when writing is not executed. After this operation, data in the PDC is transferred to the DDC, and a potential of the TDC is read to the PDC. The high level is latched in the PDC only when writing is not executed and when data "3" has been written in the memory cell and a threshold voltage of the cell has reached the verify voltage "d'". The low level is latched in the PDC when the threshold voltage of the cell does not reach the potential "d'" and when data "1" or "2" has been written in the memory cell.

When the PDC is on the low level, the write operation is again executed, and this program operation and the verify operation are repeated until data in the PDCs of all the data storage circuits are set to the high level (S28).

In the program verify operation, the three verify operations are executed after one program operation. However, in an initial program loop, a threshold voltage is not increased. Therefore, it is possible to eliminate verifying the memory cell data "3", or verifying the memory cell data "3" and verifying the memory cell data "2". Further, in a program loop close to end, writing the memory cell data "1", or writing the memory cell data "2" and the memory cell data "1" has been terminated. Therefore, these verify operations may be eliminated. When verifying the memory cell data "1" is not necessary, data stored in the SDC does not have to be held. Therefore, data required for writing the next data can be read from the outside.

(Erase Operation)

An erase operation is executed in units of the block indicated by a broken line in FIG. 3. Furthermore, this operation is executed with respect to two bit lines (BLie and BLio) connected with each data storage circuit 10 at the same time. After erasing, a threshold value of a cell becomes memory cell data "0" as shown in FIG. 9C. In case of the RLSB or REASB method, a threshold voltage of an erasing target cell must be shallowly set. Therefore, after the erase operation, all word lines in a block are selected to perform the program and program verify read operations, and the write operation is executed until the verify level "z" is reached as shown in FIG. 9C. At this time, in the program and program verify read operations, all word lines are selected, and a potential of a selected word line in verifying is set to z (e.g., −3 V). In other points, these operations are executed like the regular program and program verify read operations. In this manner, the threshold voltage after erasing is slightly shallowly set.

According to the embodiment, a plurality of threshold voltages including data "0" are set on a negative voltage side lower than 0 V. That is, data "0" and "1" are set on the negative voltage side. Therefore, it is good enough to set two sets of data, i.e., data "2" and "3" in a range of the read voltage Vread. Therefore, since the number of sets of data which are set in the range of the read voltage Vread which is the same as the related art can be reduced, a threshold voltage distribution of each data can expanded. Therefore, the number of times of program and verify operations can be decreased, and a writing speed can be increased.

Further, as described above, the write voltage Vpgm is supplied to a word line of a selected cell in writing, and the write voltage Vpgm is increased little by little in the program verify operation and writing is repeated until a threshold voltage of the selected cell reaches a predetermined threshold voltage. As shown in FIG. 1B, in case of this embodiment, the verify levels VC and VD can be set slightly lower that those in the related art depicted in FIG. 1A. Therefore, there is an advantage that the write voltage Vpgm can be reduced, a withstand voltage of a peripheral circuit can be decreased and the pump circuit which generates the write voltage Vpgm can be reduced in size.

It is to be noted that the above has described the two-bit or four-valued data in the foregoing embodiment. However, the present invention is not restricted thereto, and the foregoing embodiment can be applied to an example of eight-valued data consisting of three bits and 16-valued or higher-valued data consisting of four bits. In case of storing such multivalued data, it is good enough to set four-valued data on the negative side in case of eight-valued data and eight-valued data on the same side in case of 16-valued data, for example.

Figure 15A:
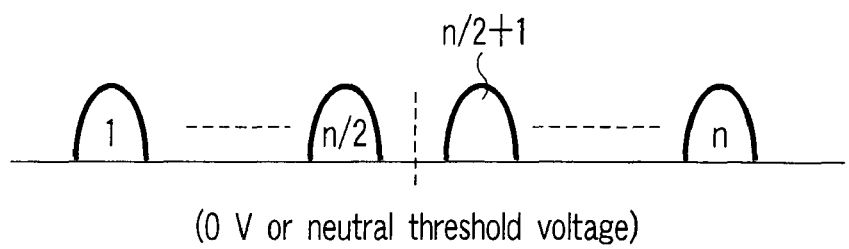
FIGS. 15A, 15B and 15C are views showing a modification of the present embodiment.

Moreover, in the foregoing embodiment, a central part of a plurality of threshold voltage distributions as multivalued data is set to 0 V. However, the present invention is not restricted thereto, and a central part of multivalued data may be set to a neutral threshold voltage (a threshold voltage when an electron does not exist in a floating gate) as shown in FIG. 15A, for example.

Figure 15B:
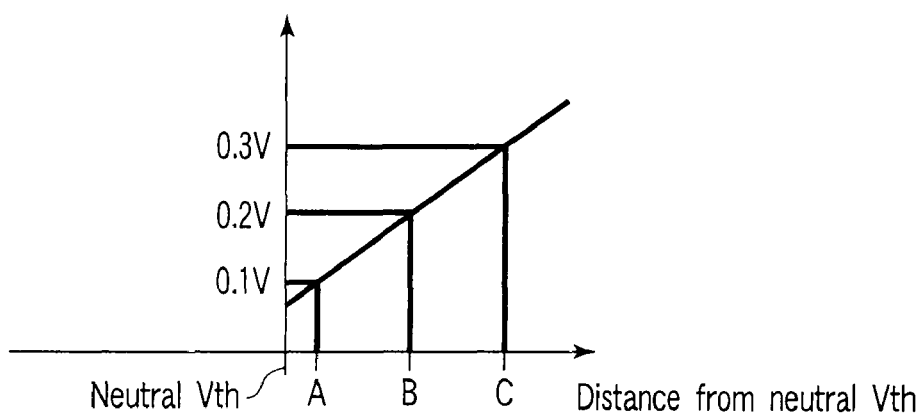
Figure 15C:
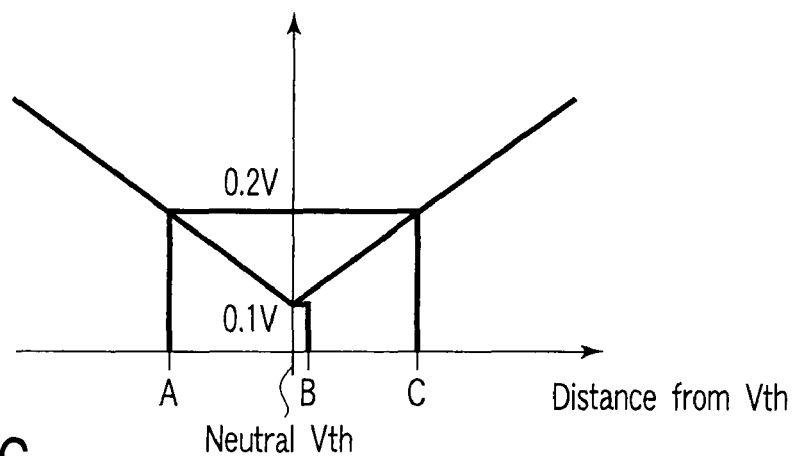

Additionally, FIGS. 15B and 15C show a relationship between a difference B, C or D between each threshold voltage and a neutral threshold voltage and a necessary data retention. As shown in FIGS. 15B and 15C, a necessary data retention margin, i.e., a difference VB–RB, VC–RC or VD–RD between a verify level VB, VC or VD and a read level RB, RC or RD shown in FIGS. 1A and 1B must be largely set as becoming apart from the neutral threshold voltage.

In case of the related art shown in FIG. 15B, VB–RB concerning the difference B from the neutral threshold voltage is 0.1 V, VC–RC concerning the difference C from the same is 0.2 V, and VD–RD concerning the difference D from the same is 0.3 V. A sum total of the differences is 0.6 V. Therefore, a margin of 0.6 V must be set in the related art.

On the contrary, in case of the present embodiment shown in FIG. 15C, VB–RB concerning the difference B is 0.2 V, VC–RC concerning the difference C is 0.1 V, and VD–RD concerning the difference D is 0.2 V. A sum total of the differences is 0.5 V. Therefore, setting a margin of 0.5 V can suffice.

A total margin can be reduced in this manner, more data can be stored in a range of Vread.

It is to be noted that the row decoder is formed in the P well 58 in the foregoing embodiment. However, the present invention is not restricted thereto, and it is good enough to form the row decoder in the substrate 51 as indicated by a broken line in FIG. 5, supply a negative voltage (–2 V) to the substrate 51 and feed a negative voltage (–3 V) to a selected word line in the erase verify read operation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor memory device comprising:
a first conductivity type substrate;
a second conductivity type first well region formed in the substrate;
a first conductivity type second well region formed in the first well region;
a memory cell array formed on the second well region, the memory cell array including a plurality of memory cells;
a second conductivity type third well region formed in the substrate;
a first conductivity type fourth well region formed in the third well region; and
a row decoder including a selection transistor having a source and a drain region, and the row decoder provided on the fourth well region, and the drain region connecting to one of the plurality of memory cells.

2. The device according to claim 1, wherein when data of the memory cell array are erased, an erase voltage is supplied to the first and second well regions, and a potential which is a ground potential or more and the erase voltage or less is supplied to the fourth well region.

3. The device according to claim 1, wherein when data are written to the memory cells of the memory cell array, a ground potential is supplied to the first and second well regions, and a negative potential is supplied to the fourth well region.

4. The device according to claim 1, wherein when data are read from the memory cells of the memory cell array, a ground potential is supplied to the first and second well regions, and a negative potential is supplied to the fourth well region.

5. The device according to claim 1, wherein the row decoder comprises transistors, each of which includes a gate insulating film thicker than that of the memory cells.

6. The device according to claim 1, wherein the first and third well regions are formed at a same time.

7. The device according to claim 1, wherein the second and fourth well regions are formed at a same time.

* * * * *